(12) United States Patent
Li et al.

(10) Patent No.: US 8,952,512 B2
(45) Date of Patent: *Feb. 10, 2015

(54) WAFER-LEVEL PACKAGE STRUCTURE OF LIGHT EMITTING DIODE AND MANUFACTURING METHOD THEREOF

(71) Applicant: China Wafer Level CSP Ltd., Jiang Su (CN)

(72) Inventors: Junjie Li, Jiang Su Province (CN);
Wenbin Wang, Jiang Su Province (CN);
Qiuhong Zou, Jiang Su Province (CN);
Guoqing Yu, Jiang Su Province (CN);
Wei Wang, Jiang Su Province (CN)

(73) Assignee: China Wafer Level CSP Ltd. (CN)

( * ) Notice: Subject to any disclaimer, the term of this patent is extended or adjusted under 35 U.S.C. 154(b) by 0 days.

This patent is subject to a terminal disclaimer.

(21) Appl. No.: 13/866,608

(22) Filed: Apr. 19, 2013

(65) Prior Publication Data
US 2013/0228817 A1 Sep. 5, 2013

Related U.S. Application Data

(62) Division of application No. 12/708,943, filed on Feb. 19, 2010, now Pat. No. 8,445,919.

(30) Foreign Application Priority Data

Jul. 7, 2009 (CN) .......................... 2009 1 0152235

(51) Int. Cl.
*H01L 23/02* (2006.01)
*H01L 33/62* (2010.01)
*H01L 33/48* (2010.01)
*H01L 33/60* (2010.01)

(52) U.S. Cl.
CPC .............. *H01L 33/62* (2013.01); *H01L 33/486* (2013.01); *H01L 33/60* (2013.01); *H01L 2933/0033* (2013.01); *H01L 2224/16* (2013.01)

USPC .............. 257/678; 257/79; 257/396; 257/687; 257/734; 257/774; 257/E21.006; 257/E21.053; 257/E21.077; 257/E21.17; 257/E21.267; 257/E21.278; 257/E21.293; 257/E21.32; 257/E21.324; 257/E21.352; 257/E21.499; 257/E21.249; 257/E2.509

(58) Field of Classification Search
USPC ............... 257/79, 59, 88, 199, 288, 347, 649, 257/678, 687, 396, 760, 734, 717, 774, 257/E21.006, E21.007, E21.077, E21.053, 257/E21.17, E21.267, E21.278, E21.293, 257/E21.32, E21.324, E21.352, E21.249, 257/E21.499, E21.509; 438/106
See application file for complete search history.

(56) References Cited

U.S. PATENT DOCUMENTS

| | | | |
|---|---|---|---|
| 7,663,231 B2 | 2/2010 | Chang et al. | |
| 7,943,426 B2 | 5/2011 | Hwan | |
| 8,445,919 B2 * | 5/2013 | Li et al. | 257/79 |
| 2010/0237378 A1 | 9/2010 | Lin et al. | |

FOREIGN PATENT DOCUMENTS

CN 101231975 A 7/2008

* cited by examiner

*Primary Examiner* — David Nhu
(74) *Attorney, Agent, or Firm* — Cantor Colburn LLP

(57) ABSTRACT

A wafer-level package structure of a light emitting diode and a manufacturing method thereof are provided in the present invention. The wafer-level package structure of a light emitting diode includes a die, a first insulating layer, at least two wires, bumps, an annular second insulating layer on the wires and the insulating layer, the annular second insulating layer surrounding an area between the bumps and there being spaces arranged between the second insulating layer and the bumps; a light reflecting cup on the second insulating layer; at least two discrete lead areas and leads in the lead areas. The technical solution of the invention reduces the area required for the substrate; and the electrodes can be extracted in the subsequent structure of the package without gold wiring to thereby further reduce the volume of the package.

18 Claims, 15 Drawing Sheets

WAFER-LEVEL PACKAGE STRUCTURE OF LIGHT EMITTING DIODE AND MANUFACTURING METHOD THEREOF

CROSS REFERENCE TO RELATED APPLICATIONS

The present application is a divisional application of U.S. patent application Ser. No. 12/708,943, filed on Feb. 19, 2010 (now issued as U.S. Pat. No. 8,445,919 B2), the entire contents of which are incorporated herein by reference. The Ser. No. 12/708,943 application claimed the benefit of the date of the earlier filed Chinese Patent Application No. 200910152235.1, filed Jul. 7, 2009, priority to which is also claimed herein, and the contents of which is also incorporated by reference herein.

FIELD OF THE INVENTION

The present invention relates to the field of semiconductor packages and in particular to a wafer-level package structure of a light emitting diode and a manufacturing method thereof.

BACKGROUND OF THE INVENTION

The Light Emitting Diode (LED) has increasingly been the most powerful competitor among solid state lighting and liquid crystal display backlight sources due to its prominent features of the lifetime of use, the high lumen efficiency, a low drive voltage, etc.

A leaded package adopted for an early light emitting diode has gradually been replaced with a surface mount package along with the advancement in the art of packages. The surface mount package is generally divided into two types, one of which is a Plastic Leaded Chip Carrier (PLCC) where the square-shaped 32-pin package is provided with leads extracting in a T-shaped way from four sides of the package and has a figure dimensioned much smaller than that of a DIP package, and the other of which is a Ceramic Leaded Chip Carrier (CLCC) with leads extracting in a T-shaped way from four sides of the package. This package technique is typically applied as a package of an ultraviolet erasable EPROM with a window, a microcomputer circuit with an EPROM, etc., and can also be referred to as QFJ or QFJ-G.

There is also disclosed in the prior art another package technique of a light emitting diode, and with particular reference to FIG. 1, the package structure of a light emitting diode includes an LED bare chip and a silicon substrate 2, the LED bare chip includes a substrate 10, an N-type epitaxial layer 11 and a P-type epitaxial layer 12, the silicon substrate 2 is provided with two separate deposited metal layers 32 and 33, the P-type epitaxial layer 12 and the N-type epitaxial layer 11 are flip-bonded over the metal layers 32 and 33 respectively through solder balls 40 and 41, the doped first isolation layers 22 and 23 are further arranged respectively in areas where the metal layers 32 and 33 are bonded with the silicon substrate 2, a U-shaped notch is arranged over the upper surface of the silicon substrate 2, the LED bare chip is located inside the U-shaped notch, the U-shaped notch is filled with transparent and insulating resin 7 and has the bottom and sides thereof covered with the metal layers 32 and 33, the outer surfaces of the metal layers 32 and 33 are light reflecting surfaces, and the second isolation layers 51 and 53 are arranged respectively between the metal layers 32 and 33 and the silicon substrate 2. The LED package structure further includes a protection layer 6 with which the outer surfaces of the metal layers 32 and 33 are covered to prevent a short circuit therebetween.

More information on the above technical solution can further be found in Chinese Patent No. 200620058968.

However in the above technique, electrodes of the LED extracts through the metal layers 32 and 33 formed on the same side of the silicon substrate, and this may result in a relatively large volume of the package; and extraction of the electrodes has to be achieved through gold wiring in the subsequent structure of the package, and also the gold wires have to be protected through resin sealing thereof to seal them in plastic, and then the electrodes are extracted, which may result in a further increased volume of the package.

Moreover in the above technique, the use of resin sealing in plastic may make the light emitting diode sealed completely, so that it may be difficult to dissipate the generated heat.

Therefore, a new LED package is desired.

SUMMARY OF THE INVENTION

A technical problem to be addressed in this application is to provide a small-size wafer-level package structure of a light emitting diode and a manufacturing method thereof.

In order to address the above technical problem, this application provides a wafer-level package structure of a light emitting diode, which includes: a die including a first side and a second side opposite to the first side; a first insulating layer on the first side of the die; at least two wires which are arranged on the insulating layer and electrically isolated from each other; bumps which are arranged on the wires and adapted to be electrically connected correspondingly with electrodes of a bare chip of the light emitting diode; at least two discrete lead areas on the second side of the die; and leads in the lead areas, electrically isolated from each other and electrically connected correspondingly with the wires.

The second side of the die further includes a heat dissipation area, spaces are arranged between the heat dissipation area and the lead areas, and a heat dissipation layer is formed on the heat dissipation area.

A lead isolation layer is formed in areas of the spaces between the heat dissipation area and the lead areas.

The leads and the wires are electrically connected correspondingly through side electrode extracting. The side electrode extracting includes a side opening arranged at the location of a cut channel between adjacent dies. A first side insulating layer, side wires and a second side insulating layer are formed in turn on the side opening. The leads and the wires are electrically connected correspondingly by the side wires.

The first side insulating layer, the second side insulating layer and the lead isolation layer are made of any one or combination of silicon oxide, photoresist and epoxy resin; the first insulating layer is made of any one or combination of silicon oxide, silicon nitride or silicon oxynitride; and the wires, the leads, the side wires and the heat dissipation layer are made of metal.

The leads and the wires are electrically connected correspondingly by Through Silicon Via. The Through Silicon Via includes vias arranged in the die. A first via insulating layer and via wires are formed in turn in the via. The leads and the wires are electrically connected correspondingly by the via wires. The first via insulating layer and the lead isolation layer are made of any one or combination of silicon oxide, photoresist and epoxy resin; the first insulating layer is made of any one or combination of silicon oxide, silicon nitride or silicon oxynitride; and the wires, the leads, the via wires and the heat dissipation layer are made of metal.

The second side of the die further includes an isolation area which is surrounded by the heat dissipation area, there is formed on the isolation area an isolation layer, and the isolation layer is made of the same material as that of a lead isolation layer.

An embodiment of the invention further provides a wafer-level package structure of a light emitting diode, which includes: a die including a first side and a second side opposite to the first side; a first insulating layer on the first side of the die; at least two wires which are arranged on the insulating layer and electrically isolated from each other; bumps which are arranged on the wires and adapted to be electrically connected correspondingly with electrodes of a bare chip of the light emitting diode; an annular second insulating layer on the wires and the insulating layer and, the annular second insulating layer surrounding an area between the bumps and there being spaces arranged between the second insulating layer and the bumps; a light reflecting cup on the second insulating layer; at least two discrete lead areas on the second side of the die; and leads in the lead areas, electrically isolated from each other and electrically connected correspondingly with the wires.

The second insulating layer is made of any one or combination of silicon oxide, silicon nitride, silicon oxynitride, photoresist and epoxy resin.

The light reflecting cup includes a light reflecting wall and a light reflecting layer on the periphery of the light reflecting wall, the light reflecting wall is made of silicon, glass or ceramic, and the light reflecting layer is made of metal.

The second side of the die further includes a heat dissipation area, spaces are arranged between the heat dissipation area and the lead areas, and a heat dissipation layer is formed on the heat dissipation area.

A lead isolation layer is formed in areas of the spaces between the heat dissipation area and the lead areas.

The leads and the wires are electrically connected correspondingly through side electrode extracting, the side electrode extracting comprises a side opening arranged at a location of a cut channel between adjacent dies, a first side insulating layer, side wires and a second side insulating layer are formed in turn on the side opening, and the leads and the wires are electrically connected correspondingly by the side wires.

The first side insulating layer, the second side insulating layer and the lead isolation layer are made of any one or combination of silicon oxide, photoresist and epoxy resin; the first insulating layer is made of any one or combination of silicon oxide, silicon nitride or silicon oxynitride; and the wires, the leads, the side wires and the heat dissipation layer are made of metal.

The leads and the wires are electrically connected correspondingly by Through Silicon Via, the Through Silicon Via comprises vias arranged in the die, a first via insulating layer and via wires are formed in turn in the via, and the leads and the wires are electrically connected correspondingly by the via wires.

The first via insulating layer and the lead isolation layer are made of any one or combination of silicon oxide, photoresist and epoxy resin; the first insulating layer is made of any one or combination of silicon oxide, silicon nitride or silicon oxynitride; and the wires, the leads, the via wires and the heat dissipation layer are made of metal.

The second side of the die further includes an isolation area which is surrounded by the heat dissipation area, there is formed on the isolation area an isolation layer, and the isolation layer is made of the same material as that of a lead isolation layer.

A method for manufacturing above the wafer-level package structure of a light emitting diode includes: providing a substrate, the substrate including a first side and a second side opposite to the first side and being divided into discrete dies, the second side of each of the dies including at least two discrete lead areas; forming a first insulating layer on the first side of each of the dies; forming on the first insulating layer of each of the dies at least two wires electrically isolated from each other and bumps on the wires, the bumps being adapted to electrically connected correspondingly with electrodes of a bare chip of the light emitting diode; and forming in lead areas on the second side of each of the dies leads electrically isolated from each other, the leads being electrically connected correspondingly with the wires.

The second side of the die further includes a heat dissipation area, spaces are arranged between the heat dissipation area and the lead areas, and the method further includes the step of forming a heat dissipation layer on the heat dissipation area.

The method further includes the step of forming a lead isolation layer in areas of the spaces between the heat dissipation area and the lead areas.

The leads and the wires are electrically connected correspondingly through side electrode extracting, the side electrode extracting includes forming a side opening at a location of a cut channel between the adjacent dies, the side opening exposes the wire on the die, a first side insulating layer, side wires and a second side insulating layer are formed in turn on the side opening, and the leads and the wires are electrically connected correspondingly by the side wires.

The second side insulating layer and the lead isolation layer are made of the same layer of material; and the leads, the side wires and the heat dissipation layer are made of the same layer of material.

Before forming the side opening at the location of the cut channel between the adjacent dies, the method further includes the step of forming a carrier on the bumps, the wires uncovered with the bumps and the first insulating layer uncovered with the wires prior to formation of the side opening at the location of the cut channel between the adjacent dies.

The leads and the wires are electrically connected correspondingly by Through Silicon Via, the Through Silicon Via includes forming vias in the die, a first via insulating layer and via wires are formed in turn in the via, and the leads and the wires are electrically connected correspondingly by the via wires.

The leads, the via wires and the heat dissipation layer are made of the same layer of material.

A method for manufacturing the above wafer-level package structure of a light emitting diode includes: providing a substrate, the substrate including a first side and a second side opposite to the first side and being divided into discrete dies, the second side of the dies includes at least two discrete lead areas; forming a first insulating layer on the first side of each of the dies; forming on the first insulating layer of each of the dies at least two wires electrically isolated from each other and bumps on the wires, the bumps being adapted to electrically connected correspondingly with electrodes of a bare chip of the light emitting diode; forming on the first insulating layer and the wires an annular second insulating layer, the annular second insulating layer surrounding the area between the bumps and there being spaces arranged between the second insulating layer and the bumps; forming a light reflecting cup on the second insulating layer; and forming in lead areas of each of the dies two leads electrically isolated from each other and electrically connected correspondingly with the wires.

The formation of the light reflecting cup on the second insulating layer includes bonding the light reflecting cup on the second insulating layer.

The second side of the die further includes a heat dissipation area, spaces are arranged between the heat dissipation area and the lead areas, and the method further includes a step of forming a heat dissipation layer on the heat dissipation area.

The method further includes a step of forming a lead isolation layer in areas of spaces between the heat dissipation area and the lead areas.

The leads and the wires are electrically connected correspondingly through side electrode extracting, the side electrode extracting includes forming a side opening at the location of a cut channel between the adjacent dies, the side opening exposes the wire on the die, a first side insulating layer, side wires and a second side insulating layer are formed in turn on the side opening, and the leads and the wires are electrically connected correspondingly by the side wires.

The second side insulating layer and the lead isolation layer are made of the same layer of material; and the leads, the side wires and the heat dissipation layer are made of the same layer of material.

The leads and the wires are electrically connected correspondingly by Through Silicon Via, the Through Silicon Via includes forming vias in the die, a first via insulating layer and via wires are formed in turn in the via, and the leads and the wires are electrically connected correspondingly by the via wires.

The leads, the via wires and the heat dissipation layer are made of the same layer of material.

As compared with the prior art, in the wafer-level chip-size package according to the invention, the leads are formed on the second side of the substrate to extract the electrodes of the light emitting diode, that is, the light emitting diode and the leads thereof are located on the two opposite sides of the substrate in the technical solution of the invention, to thereby reduce the area required for the substrate; and the electrodes can be extracted in the subsequent package structure without gold wiring to thereby further reduce the volume of the package.

In the wafer-level chip-size package of the light emitting diode according to the invention, an area occupied for subsequent mounting the package structure on the substrate can be made relatively small to thereby accommodate a larger space to be utilized for the substrate.

Moreover, in the technical solution of the invention, resin sealing in plastic can be omitted to thereby facilitate dissipation of the generated heat.

In the wafer-level chip-size package according to the invention, the heat dissipation area can be formed on the second side of the substrate to thereby facilitate dissipation of the generated heat.

DETAILED DESCRIPTION OF THE INVENTION

In a wafer-level chip-size package technique of a light emitting diode according to the invention, leads are formed on a second side of a substrate to extract electrodes of the light emitting diode, that is, the light emitting diode and the leads thereof are located on two opposite sides of the substrate in the technical solution of the invention, to thereby reduce the area required for the substrate; and the electrodes can be extracted in the subsequent package structure without gold wiring to thereby further reduce the volume of the package.

In the wafer-level chip-size package according to the invention, a heat dissipation area is formed on the second side of the substrate to thereby further facilitate dissipation of the generated heat.

Embodiments of the invention will be detailed below with reference to the drawings.

Figure 1:
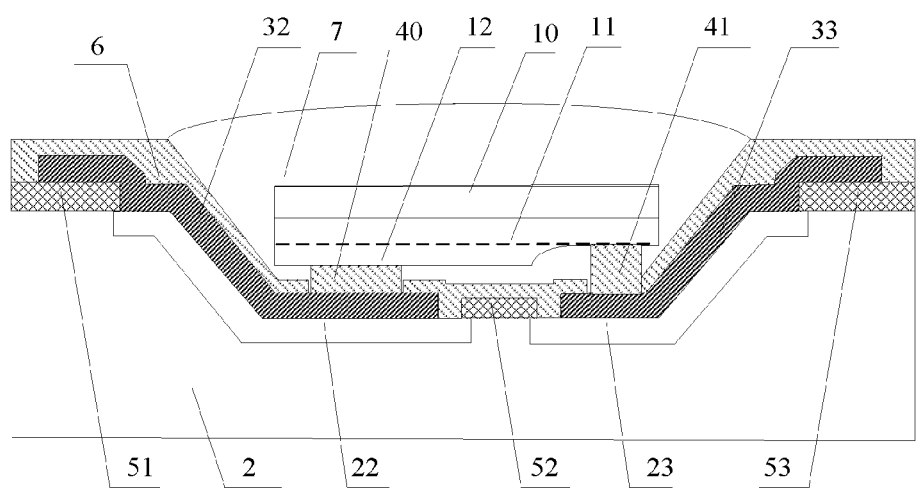
FIG. 1 is a schematic structural diagram of a package structure of a light emitting diode in the prior art.
Figure 2:
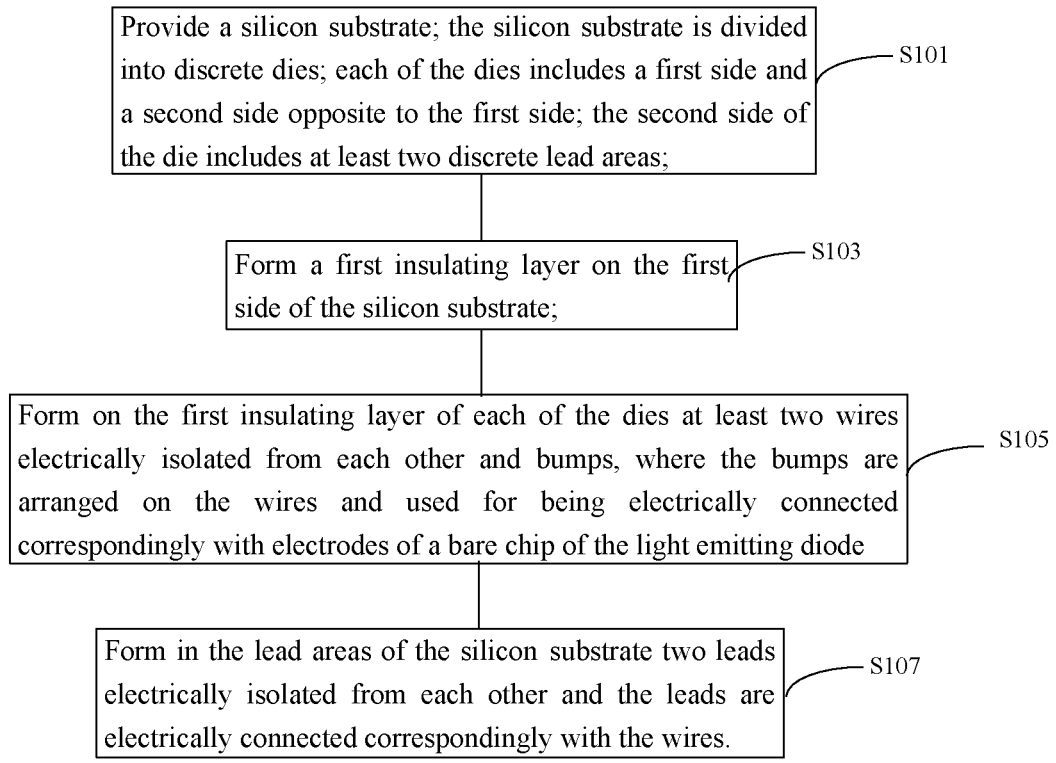
FIG. 2 is a schematic flow diagram of a method for manufacturing a package of a light emitting diode according to a first embodiment of the invention.

The invention firstly provides a method for manufacturing a wafer-level package structure of a light emitting diode, and particular reference is made to FIG. 2 illustrating a schematic flow diagram of the method for manufacturing a wafer-level chip-size package of a light emitting diode according to the invention. The method includes the following steps: step S101, there is provided a substrate divided into discrete dies, each of the dies including a first side and a second side opposite to the first side, where the second side of the die includes at least two discrete lead areas; step S103, a first insulating layer is formed on the first side of each of the dies; step S105, there are formed on the first insulating layer of each of the dies at least two wires electrically isolated from each other and bumps, where the bumps are arranged on the wires and used for being electrically connected correspondingly with electrodes of a bare chip of the light emitting diode; step S107, there are formed in the lead areas of the substrate two leads electrically isolated from each other and the leads are electrically connected correspondingly with the wires.

FIG. 3 to FIG. 16 are schematic structural diagrams of cross section of the method for manufacturing a package of a light emitting diode according to the first embodiment of the invention.

Figure 3:
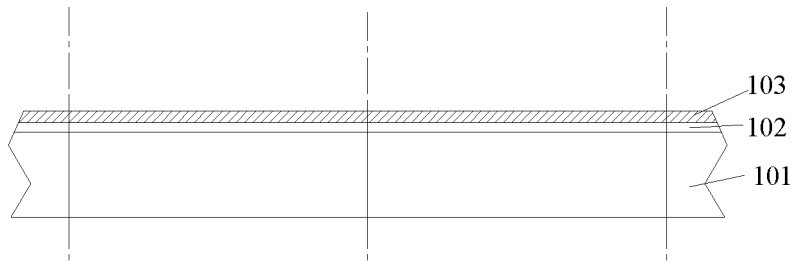
FIG. 3 to FIG. 16 are schematic structural diagrams of cross sections of the method for manufacturing a package of a light emitting diode according to the first embodiment of the invention.

With reference to FIG. 3, firstly there is provided a substrate 101, which including a first side and a second side opposite to the first side and being divided into discrete dies, taking two dies as an example in this embodiment. The dies are isolated with dash dotted lines and each of which has the second side including at least two discrete lead areas.

The substrate 101 may be a raw semiconductor substrate, e.g., a conventional semiconductor substrate of SI, GaAs, GaN, etc., or a semiconductor substrate with a semiconductor device formed therein, e.g., with a drive circuit, etc., formed internal thereto, but the scope of the invention will not be limited to these.

A first insulating layer 102 is formed on each of the dies for the purpose of isolation from the substrate 101 and the first insulating layer 102 may be made of silicon oxide, silicon nitride, silicon oxynitride, photoresist, epoxy resin, etc., with a thickness larger than or equal to 0.3 μm.

It shall be noted here that if none of device layers constituting semiconductor devices is formed in the substrate 101, the first insulating layer 102 is formed on the substrate 101 during a packaging phrase; otherwise, the step of forming the first insulating layer 102 may be omitted because an insulating layer (or a passivation layer) is always formed uppermost in a final step of fabricating a semiconductor device in the substrate 101 to prevent reaction of some conductive materials with the air, that is, the insulating layer or the passivation layer will be arranged over the substrate 101 prior to the packaging of a light emitting diode, thereby the insulating layer or the passivation layer may act as the first insulating layer 102.

Next, there are formed on the first insulating layer of each of the dies at least two wires electrically isolated from each other and bumps, where the bumps are arranged on the wires and used for being electrically connected correspondingly with electrodes of a bare chip of the light emitting diode. This step can be performed in two methods, one of which is to form firstly the wires and then the bumps. Particular reference is made to FIG. 3 to FIG. 5.

With reference to FIG. 3, firstly there is formed on the first insulating layer 102 a wire layer 103 with a thickness ranging from 1.0 μm to 3.5 μm, and the wire layer 103 is made of a conductive material, e.g., metal and preferably aluminium. The wire layer 103 may be formed through various vacuum deposition processes, e.g., a spaying process.

Figure 4:
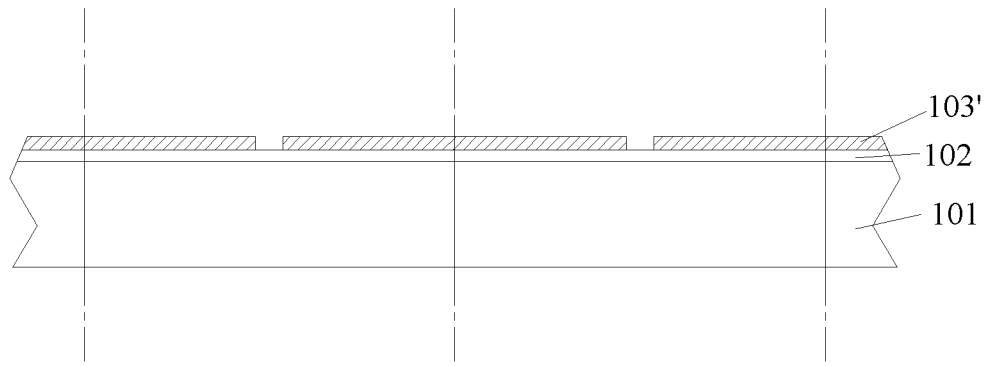

Referring to FIG. 4, the wire layer 103 is patterned into wires 103'. The patterning generally utilizes photolithographic and etching processes including the steps of coating, exposing, developing, etching, etc., of a photoresist layer, and since it is well known to those skilled in the art, repeated descriptions will be omitted here.

Figure 5:
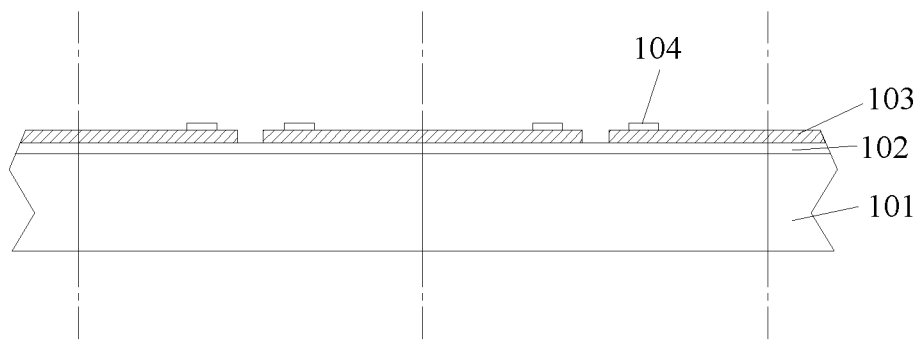

Referring to FIG. 5, bumps 104 are formed on the wires 103' to be electrically connected correspondingly with the electrodes of the bare chip of the light emitting diode. A process of forming the bumps 104 is well known to those skilled in the art, and therefore repeated descriptions will be omitted here.

It shall be noted here that the number of the bumps 104 may not be in one-to-one correspondence with that of the wires, but the number of the bumps 104 are at least two. If a plurality of light emitting diodes need to be packaged over each of the dies, the number of the bumps 104 can be determined according to the connection way of the light emitting diodes, e.g., in series or parallel, whether they are controlled individually or commonly, etc. Those skilled in the art can readily conclude how to arrange a relationship between the bumps and the wires, and although two wires and two bumps are illustrated here, the scope of the invention will not be limited thereto.

Figure 6:
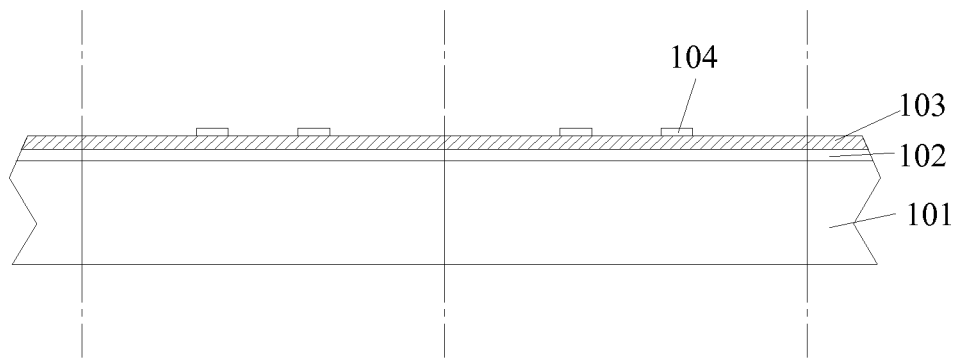
Figure 7:
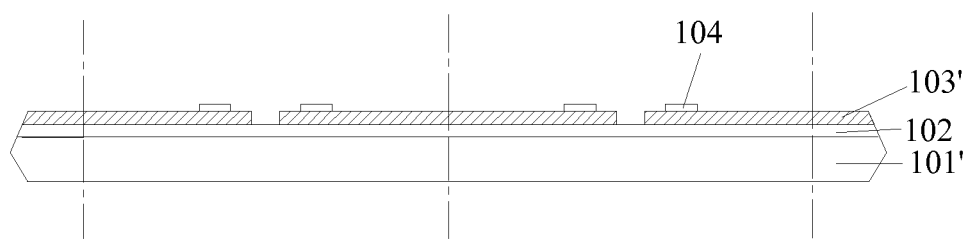

Alternatively, the at least two wires electrically isolated from each other and the bumps can be formed on the first insulating layer of each of the dies in the step S105 in another method of, for example, forming firstly the bumps 104 and then the wires 103 with particular reference to FIG. 6 to FIG. 7.

Firstly, referring to FIG. 6, the wire layer 103 as described above is formed on the first insulating layer 102.

Next, the bumps 104 are formed on the wire layer 103.

Then, referring to FIG. 7, the wires 103' are formed from the wire layer 103. A specific process thereof includes: forming a photoresist layer on the wire layer 103 and the bumps 104, forming a wire pattern through a photolithographic process and etching the wire layer 103 through an etching process to form the wires 103'.

Either of the above two methods can be utilized to form the wires and the bumps on the first side of the substrate, and can be selected by those skilled in the art as needed in practice.

The substrate 101 is thinned in the direction perpendicular to the second side to form the substrate 101' to thereby facilitate formation of a smaller, lighter and thinner package structure, subsequent formation of an opening 105, and also heat dissipation. Of course, thinning here shall not damage any semiconductor device structure, if any, formed in the substrate 101.

Two leads electrically isolated from each other are formed in the lead areas of the substrate, the leads being electrically connected correspondingly with the wires. The leads electrically connected correspondingly with the wires 103' can be formed in the lead areas in two methods, one of which is to adopt side electrode extracting for correspondingly electrical connection with reference to FIG. 8 to FIG. 16, and the other of which is to adopt Through-Silicon Via (TSV) for correspondingly electrical connection with reference to FIG. 18 to FIG. 25.

Firstly, side electrode extracting will be detailed below with reference to FIG. 8 to FIG. 16.

Figure 8:
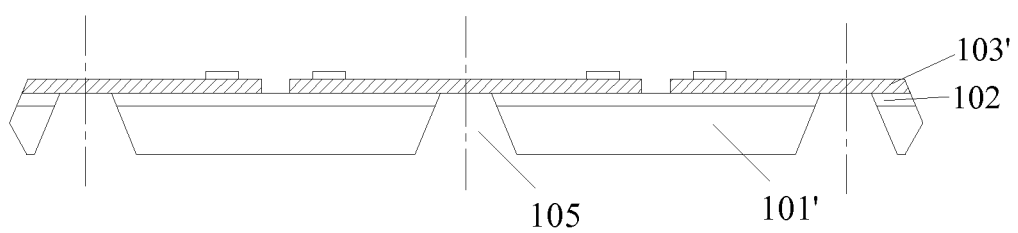

Referring to FIG. 8, the side opening 105 exposing the wire on the die is formed at the location of a cut channel between the adjacent dies of the substrate 101'. The specific process thereof includes: coating a photoresist layer on the second side of the substrate 101', forming the opening at the cut channel (between two adjacent dies) using photolithographic and etching the substrate 101' using the photoresist layer as a mask until the wires 103' on the first side of the substrate 101' are exposed. In order to ensure complete etching, part of the wires 103' are typically over-etched, that is, the wires 103' are partially etched instead of stopping etching once the wires 103' is to be etched, to further achieve a large contact area with a subsequently deposited conductive layer and hence the advantage of a reduced contact resistance therewith.

It shall be noted here that since a first side insulating layer needs to be formed subsequently in the opening, etching here can alternatively be continued until the first insulating layer 102 on the first side is exposed, that is, once the first insulating layer 102 is exposed, and then the wires 103' are exposed in a mechanical semi-cutting process prior to subsequent formation of the first side conducting layer.

The substrate 101' is etched typically through a plasmas etching process, and since this process is a conventional process in the prior art, repeated descriptions thereof will be omitted there.

Figure 9:
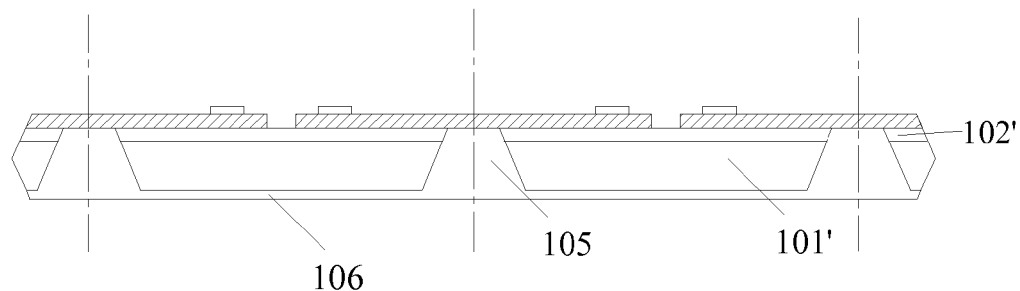

Referring to FIG. 9, the first side insulating layer 106 is formed in the opening 105 and on the second side of the substrate 101', the first side insulating layer 106 being used for electrically isolating side conductive layers subsequently formed on the sides from the substrate 101'.

The first side insulating layer 106 is made of any one or combination of silicon oxide, silicon nitride, silicon oxynitride and photoresist. If the first side insulating layer 106 is made of silicon oxide, silicon nitride or silicon oxynitride, it may be formed through a PECVD process, thickness of the first side insulating layer being arranged for complete electrical insulated from the substrate; or if the first side insulating layer 106 is made of photoresist, it may be formed through a resist scraping or spin coating process, where an electro deposition process can also be adopted for electro deposition photoresist (EDPR), and the colloid photoresist typically can fill up the opening 105.

The first side insulating layer 106 may alternatively be made of another photosensitive material, e.g., Hexamethyl Disilazane (HMDS), etc. In order to further simplify the process, the first side insulating layer 106 is preferably made of a material with good properties of heat conduction and of insulating.

A heat dissipation area is further arranged on each of the dies of the substrate 101' to dissipate heat generated from the use of the light emitting diode. The heat dissipation area is arranged on the second side of each of the dies according to the invention, the heat dissipation area being spaced from the lead areas.

Figure 10:
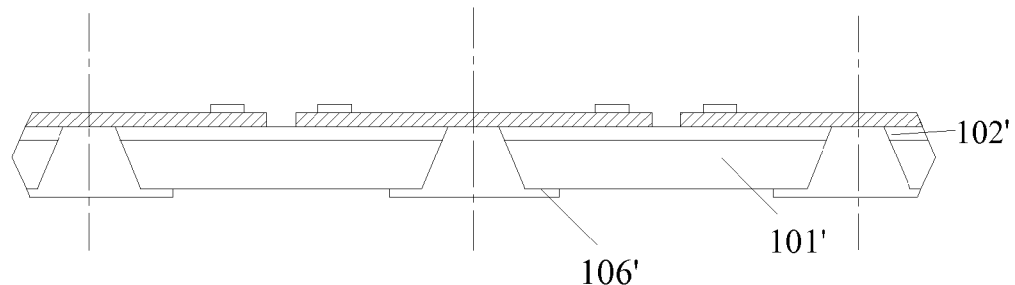

The invention further includes the step of forming a heat dissipation layer on the heat dissipation area, and reference is made to FIG. 10, which illustrating the step of exposing the heat dissipation area on the second side of the substrate 101'. A specific process thereof includes: forming a photoresist layer on the second side of the substrate 101', patterning the photoresist layer to form a pattern of heat dissipation area and developing the photoresist layer to remove the first side insulating layer 106 on the heat dissipation area to thereby form the first side insulating layer 106'.

In this embodiment, the heat dissipation layer on the heat dissipation area does not include the above first side insulating layer 106 but is only of metal. In fact, the heat dissipation layer on the heat dissipation area may or may not include the above first side insulating layer 106 but be only of metal depending upon a specific condition of the substrate.

If a semiconductor device is formed in the substrate 101, the second side of the substrate 101 shall be insulated from a conductive material, and therefore the heat dissipation layer must include the above first side insulating layer 106; if a semiconductor device is formed in the substrate 101 and the substrate 101 is a Silicon-On-Insulator (SOI) thin film, the heat dissipation layer may not include the first side insulating layer 106 but be only of metal because the semiconductor device is typically formed in the uppermost silicon layer of the SOI, that is, an isolation layer is provided between the semiconductor device and an underlying silicon layer of the SOI; and if the substrate 101 is a raw substrate without any semiconductor device formed inside, the first side insulating layer 106 may or may not be included.

Since the first side insulating layer 106 has a good property of heat conduction, even if being added to the heat dissipation layer, the heat dissipation capability of the package structure will not be greatly influenced. However, since the first side insulating layer 106 is usually inferior in heat conduction to metal, the first side insulating layer 106 may preferably not be included. This embodiment has been described taking a raw substrate as an example without the first side insulating layer 106 on the heat dissipation area, and it shall be noted that the scope of the invention will not be limited thereto.

Figure 11:
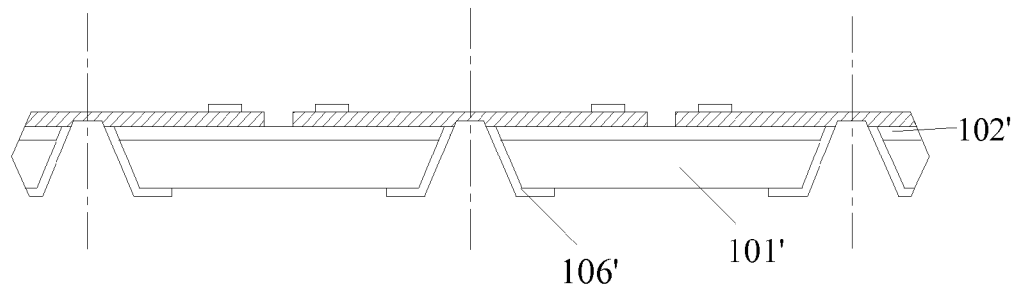

Referring to FIG. 11, a mechanical semi-cut is performed at the opening 105 filled with the first side insulating layer 106' to expose the wires 103' at the substrate 101'. The mechanical semi-cut technique is well known to those skilled in the art, and therefore repeated descriptions thereof will be omitted here.

Figure 12:
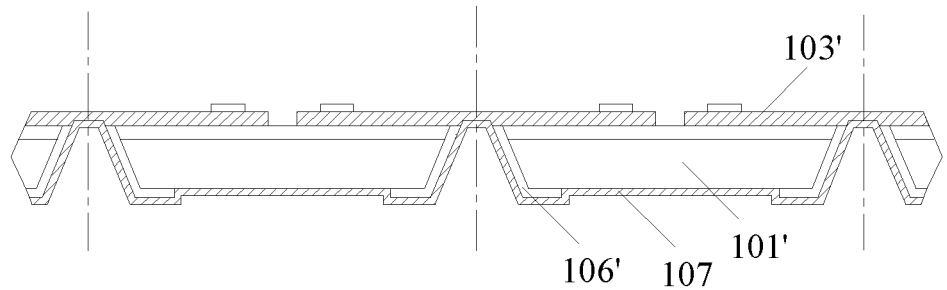

Referring to FIG. 12, a first side conductive layer 107 is formed on the first side insulating layer 106' and the heat dissipation area from which the first side insulating layer 106 is removed, to be electrically connected with the wires 103' on the first side of the substrate 101' while forming a heat dissipation layer. The first side conductive layer 107 may be formed of metal, e.g., aluminium, etc.

The first side conductive layer 107 is in a thickness ranging from 5 μm to 7 μm.

Figure 13:
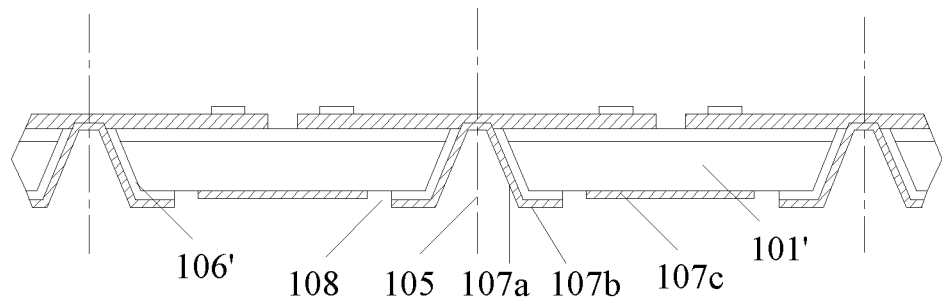

Reference is made to FIG. 13, which illustrating the steps of forming side wires, forming a heat dissipation layer on the heat dissipation area and forming leads in the lead areas. All of the side wires, the heat dissipation layer on the heat dissipation area and the leads are formed from the first side conductive layer 107. A specific process includes: coating a photoresist layer; exposing, developing and etching the photoresist using a mask formed with the heat dissipation area, the side wires and the lead areas to remove the first side conductive layer 107 except the heat dissipation area, the opening 105 and the lead areas to form respectively the side wires 107a, the leads 107b and the heat dissipation layer 107c. Spaces 108 are arranged between the leads 107b and the heat dissipation layer 107c.

Then, the side wires 107a, the leads 107b and the heat dissipation layer 107c are electroplated for increasing their thicknesses and reducing line resistances and for good contact with the subsequent substrate.

The number of the leads 107b may not be in one-to-one correspondence with that of the side wires 107a, and in a practical circuit, they can be arranged according to the connection way of light emitting diodes, for example, whether the light emitting diodes are connected in series or parallel on a chip and whether they need to be controlled individually by the user, etc.

Figure 14:
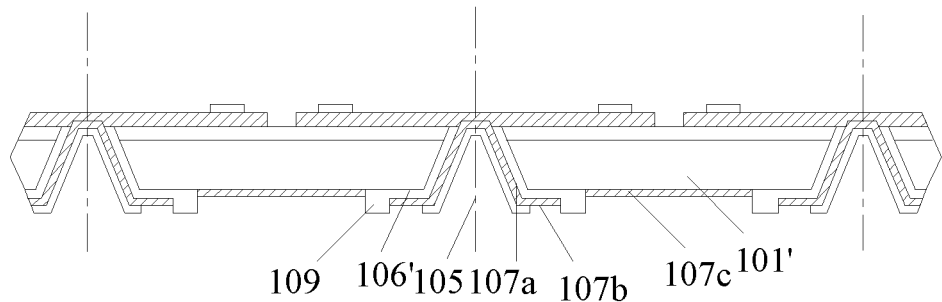

Referring to FIG. 14, a second side insulating layer 109 is formed both on the first side conductive layer 107 at the opening 105 and at the spaces between the lead areas and the heat dissipation areas. A specific process thereof includes: forming the second side insulating layer 109 on the side wires 107a, the leads 107b and the heat dissipation layer 107c; removing the second side insulating layer 109 on the heat dissipation area and the lead areas through photolithographic and etching processes to expose the heat dissipation layer 107c and the leads 107b on the lead areas.

The second side insulating layer 109 is made of any one or combination of silicon oxide, silicon nitride, silicon oxynitride, photoresist and epoxy resist, and a thickness of the second side insulating layer 109 ranges from 10 μm to 100 μm. The second side insulating layer 109 is formed for the purpose of resistance against a solder coated during mounting with the substrate to thereby prevent electrical connection between the leads 107b and the heat dissipation layer 107c.

The lead isolation layer between the lead areas and the heat dissipation area is formed from the second side insulating layer 109 in this embodiment, and alternatively may be formed from the first and second side insulating layers together, that is, the first side insulating layer 105 between the lead areas and the heat dissipation area will be retained instead of being removed in this embodiment, to also achieve the effect of the invention. It shall be noted that the scope of the invention will not be limited thereto.

Figure 15:
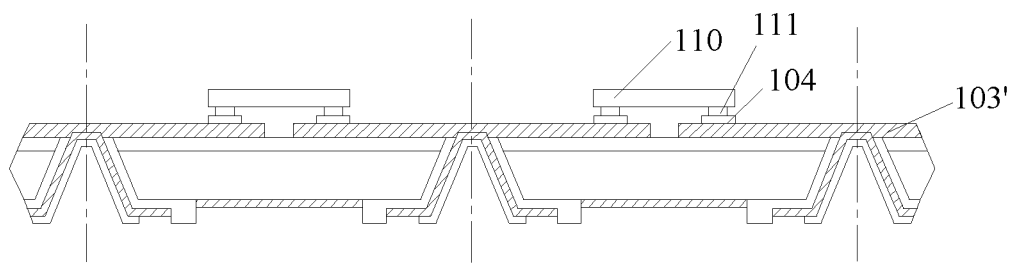

Referring to FIG. 15, the electrodes 111 of the light emitting diode are connected with the bumps 104, the light emitting diode further includes the bare chip 110, the electrodes 111 are adapted to extract the electrodes of the light emitting diode in the bare chip 110, and the electrodes 111 of the light emitting diode and the bumps 104 are connected through a metal bonding. The metal bonding technique is well known to those skilled in the art, and therefore repeated descriptions thereof will be omitted here.

Figure 16:
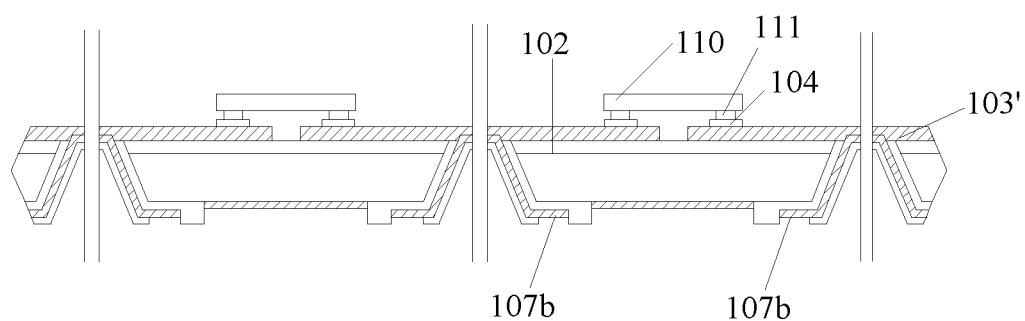

Referring to FIG. 16, the package structure of the single light emitting diode is formed by cutting along the cut channel. Only one light emitting diode is illustrated in this embodiment, but a plurality of light emitting diodes may be packaged over a chip during a practical process. Those skilled in the art can devise a flexible arrangement in view of general knowledge in the art without departing from the scope of the invention.

Based upon the above first embodiment, there is formed a package structure of a light emitting diode according to an embodiment of the invention, with reference to FIG. 16, which includes: a die including a first side and a second side opposite to the first side; a first insulating layer 102 on the first side of the die; at least two wires 103' which are arranged on the first insulting layer 102 and electrically isolated from each other; bumps 104 which are arranged on the wires 103' and adapted to be electrically connected correspondingly with electrodes 111 of a bare chip of the light emitting diode; at least two discrete lead areas on the second side of the die; and leads 107*b* in the lead areas, electrically isolated from each other and electrically connected correspondingly with the wires 103'.

The leads 107*b* are electrically connected correspondingly with the wires 103' through side electrode extracting.

Figure 17:
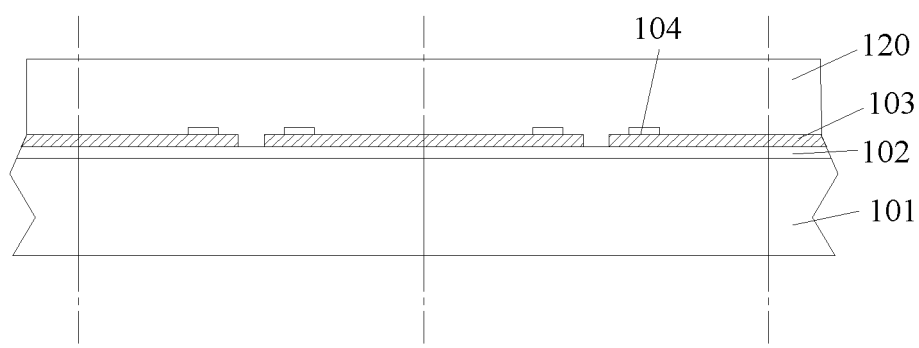
FIG. 17 is a schematic structural diagram of the method for manufacturing a package of a light emitting diode according to a second embodiment of the invention.

Preferably, the invention further provides another method for manufacturing the above wafer-level size package structure of a light emitting diode as a second embodiment of the invention. The second embodiment of the invention differs from the first embodiment in that a carrier is formed on the bumps 104, the wires 103' uncovered with the bumps 104 and the first insulating layer 102 uncovered with the wires 103' prior to formation of the side opening 105 at the location of the cut channel between the adjacent dies of the substrate 101' to achieve a further enhanced support. With particular reference to FIG. 17, there is added the carrier 120 based upon the structure in FIG. 5. The carrier 120 may be made of glass, PVC plastic, etc., and may be connected with the substrate 101 through bonding, for example, through epoxy resin or photoresist for bonding.

Of course, the step of forming the carrier on the bumps 104, the wires 103' uncovered with the bumps 104 and the first insulating layer 102 uncovered with the wires 103' may be varied as long as it is performed prior to the step of forming the side opening 105 at the location of the cut channel between the adjacent dies of the substrate 101' in FIG. 8, for example, the carrier may be formed based upon the structure in FIG. 5 or FIG. 7 in the first embodiment, but the scope of the invention will not be limited thereto.

The carrier 120 needs to be removed prior to subsequent connecting of the electrodes 111 of the light emitting diode with the bumps 104 to form the structure as in FIG. 14, which is then cut mechanically into unit package structure bodies, and repeated descriptions thereof will be omitted here.

The invention further providing a method for manufacturing a wafer-level size package of a light emitting diode according to a third embodiment with particular reference to FIG. 3 to FIG. 7 and FIG. 18 to FIG. 25. In this embodiment, the two leads electrically isolated from each other are formed in the lead areas of the substrate by Through Silicon Via (TSV), and detailed descriptions thereof will be presented below.

The processes of forming the wires and the bumps on the first side of the substrate 101 and of thinning the substrate 101 are as described in the previous embodiment with particular reference to FIG. 3 to FIG. 7, and repeated descriptions thereof will be omitted here. For clear transition to the following descriptions, the structure with continued reference to FIG. 7 includes the thinned substrate 101' and the first insulating layer 102, the wires 103' and the bumps 104 arranged in turn on the thinned substrate 101'.

Figure 18:
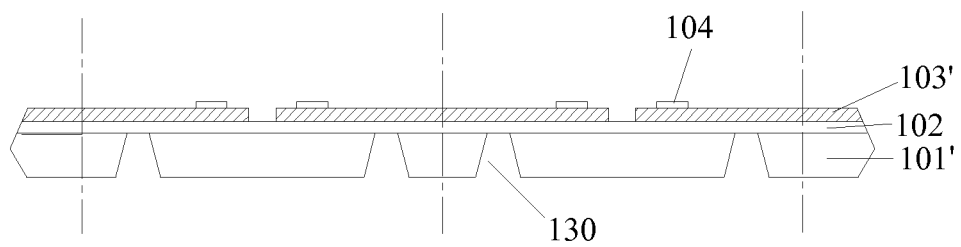
FIG. 18 to FIG. 25 are schematic structural diagrams of cross sections of the method for manufacturing a package of a light emitting diode according to a third embodiment of the invention.

Referring to FIG. 18, at least two vias 130 are formed in each of the dies. A specific process of forming the vias 130 includes: forming a photoresist on the second side of the substrate 101', forming an opening pattern of vias on each of the dies through a photolithographic process and etching the substrate 101' below the opening pattern of vias through an etching process using the photoresist as a mask until the first insulating layer 102 is exposed.

Also the number of the vias 130 may not necessarily be in one-to-one correspondence with that of the wires, but the number of the vias 130 is at least two. If a plurality of light emitting diodes needs to be packaged over each of the dies, the number of the vias 130 can be determined according to factors including a connection way of the light emitting diodes, e.g., in series or parallel, whether they are controlled individually or commonly, etc. Those skilled in the art can readily conclude how to arrange a relationship between the wires and the vias 130, and although two vias and two wires are illustrated here, but the scope of the invention will not be limited thereto.

The substrate is etched through a plasma etching process, and repeated descriptions thereof will be omitted here.

In this embodiment, the vias are cone-shaped at both ends of each of the dies and a heat dissipation area is formed between the vias. Also a variation may be possible, for example, the vias are positioned toward the heat dissipation area in this embodiment, and heat dissipation areas are formed at the locations of the original vias. The vias in this embodiment can also be vaired in shape, for example, the vias may be in a shape of cylindrical, and then a first via conductive layer to be formed subsequently may be in a shape of cylindrical instead of being in a shape of herringbone. It shall be noted that the scope of the invention will not be limited thereto.

Those skilled in the art shall further appreciate that the locations of the vias 130 also need to be designed according to the layout of a semiconductor device, if any, formed in the substrate 101, and descriptions thereof will be omitted here.

Figure 19:
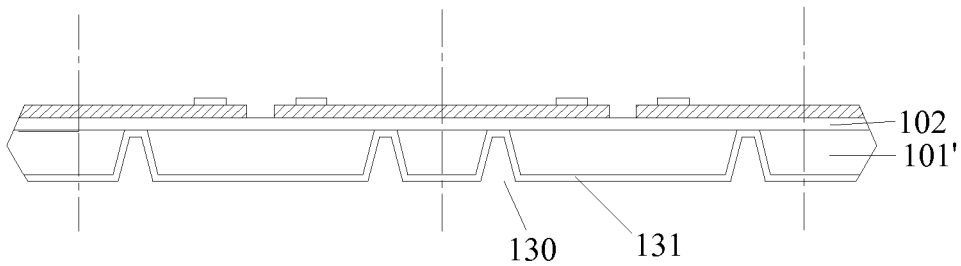

Referring to FIG. 19, there is formed the first via insulating layer 131 on the second side of the substrate 101'. The first via insulating layer 131 also covers the sidewalls and the bottom of the vias 130. The first via insulating layer 131 is adapted for electrical insulation from the substrate 101'.

The first via insulating layer 131 may be made of silicon oxide, silicon nitride, silicon oxynitride or photoresist. The first via insulating layer 131 is similar to the first side insulating layer 106 in the above first and second embodiments, and descriptions thereof will be omitted here.

Preferably, a heat dissipation area is further arranged on each of the dies of the substrate 101' to dissipate heat generated from the use of the light emitting diode. The heat dissipation area is arranged on the second side of each of the dies and a space is arranged between the heat dissipation area and the lead areas according to the invention.

The first via insulating layer 131 is not removed from the heat dissipation area in this embodiment, but the first via insulating layer 131 on the heat dissipation area may alternatively be removed as apparent from the relevant descriptions in the first embodiment, and repeated descriptions thereof will be omitted here.

Figure 20:
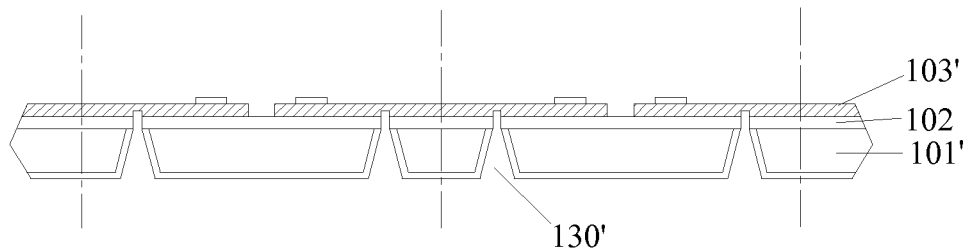

Reference is made to FIG. 20, which illustrating the step of exposing the wires 103' on the first side of the substrate 101'. A specific process thereof includes: continuing with etching the first insulating layer 102 using the first via insulating layer 131 on the both sides of the vias 130 as a mask (of course, alternatively using photoresist as a mask according to a practical scenario) until the wires 103' are exposed. Some of the wires 103' are typically over-etched in this step to prevent a contact resistance from being influenced due to uncompleted etching of the first insulating layer 102, and over-etching of some of the first insulating layer 102 may facilitate an increased contact area between a subsequently deposited via conductive layer and the wires 103' and hence reducing the contact resistance.

Figure 21:
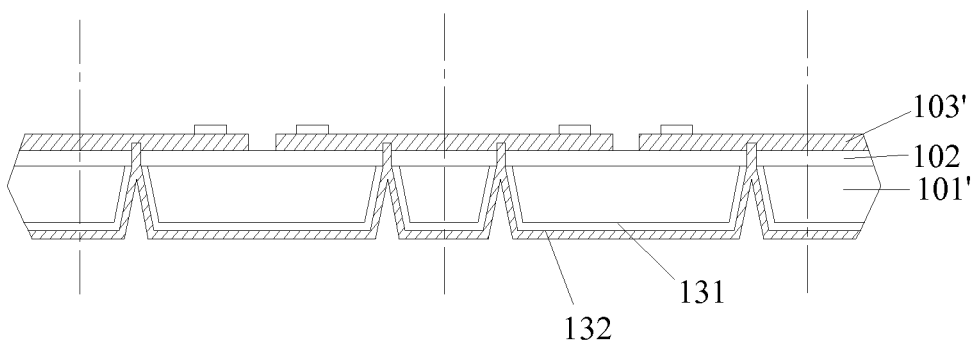

Referring to FIG. 21, a first via conductive layer 132 is formed on the first via insulating layer 131 to be electrically connected with the wires 103' on the first side of the substrate 101'. The first via conductive layer 132 may be made of metal, e.g., aluminium, etc.

The first via conductive layer 132 is in a thickness ranging from 5 μm to 6 μm.

In this embodiment, the first via conductive layer 132 is in a shape of herringbone in the vias 130 due to a relatively large size of the vias 130, but this shape will not be formed and instead the vias may be filled up if the size of the first vias is relatively small, for example, in the case of cylindrical vias. It shall be noted that the scope of the invention will not be limited thereto.

Figure 22:
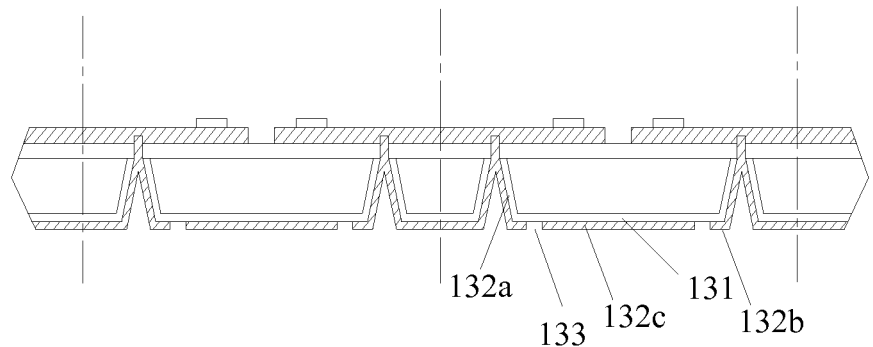

Reference is made to FIG. 22, which illustrating the steps of forming via wires, of forming a heat dissipation layer on the heat dissipation area and of forming leads in the lead areas. All of the via wires, the heat dissipation layer on the heat dissipation area and the leads are formed from the first via conductive layer 132. A specific process includes: coating a photoresist layer, patterning the photoresist using a mask formed with the heat dissipation area, the via wires and the lead areas, exposing, developing and etching to remove the first via conductive layer 132 at the isolation areas between the heat dissipation area and the lead areas to form respectively the via wires 132a, the leads 132b and the heat dissipation layer 132c. Spaces 133 are arranged between the leads 132b and the heat dissipation layer 132c.

Then, the via wires 132a, the leads 132b and the heat dissipation layer 132c are electroplated to increase thicknesses and to reduce line resistances.

Also the number of the leads 132b may not be in one-to-one correspondence with that of the via wires 132a, and they can be arranged according to a connection way of a practical circuit similarly to the above side wires, and repeated descriptions thereof will be omitted here.

In this embodiment, since the adjacent dies are geometrically symmetric with respect to the location of the cut channel, i.e., the dash dotted line in FIG. 22, in order to make full use of a space, the lead areas in the adjacent two dies are arranged respectively on the left and right halves of the "人"-shape via wires 132a, i.e., "/" and "\". Other variations are also possible, but the invention will not be limited thereto.

Figure 23:
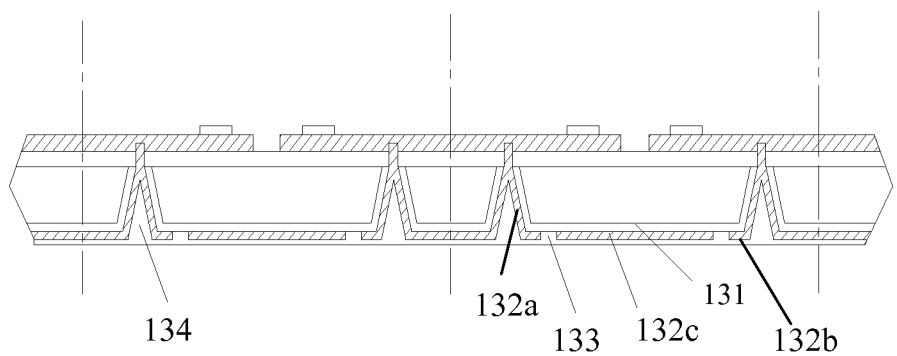

Referring to FIG. 23, a second via insulating layer 134 is formed on the above via wires 132a, leads 132b, heat dissipation layer 132c and the isolation areas 133 and the second via insulating layer 134 may be made of any one or combination of photoresist, silicon oxide, silicon nitride or silicon oxynitride. The second via insulating layer 134 is in a thickness ranging from 10 μm to 100 μm.

The second via insulating layer 134 is formed for the purpose of protecting the via wires and isolating the lead areas from the heat dissipation area.

It shall be noted that in this embodiment, the via wire layer may not necessarily fill up the vias due to a relatively large size of the vias, and those unfilled parts of the vias are filled up with the second via insulating layer 134. On the contrary, the second via insulating layer 134 will not be filled into the vias if the size of the via is relatively small.

Figure 24:
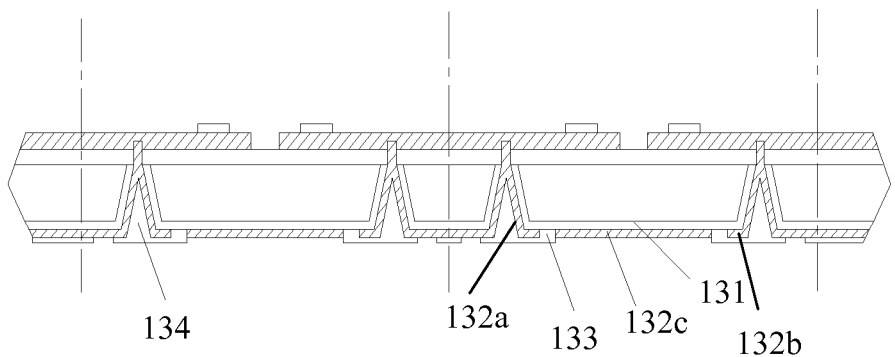

Reference is made to FIG. 24, which illustrating the step of exposing the heat dissipation layer and the leads. A specific process thereof includes: forming a photoresist layer on the second via insulating layer 134, removing the second via insulating layer 134 on the heat dissipation area and the lead areas using photolithographic and etching processes to expose the heat dissipation layer 132c and the leads 132b on the lead areas. The leads 132b and the heat dissipation layer 132c are electrically isolated by lead isolation layers 133. Also, the leads between the adjacent dies are electrically isolated by the first via insulating layer 131 and the second via insulating layer 134.

Figure 25:
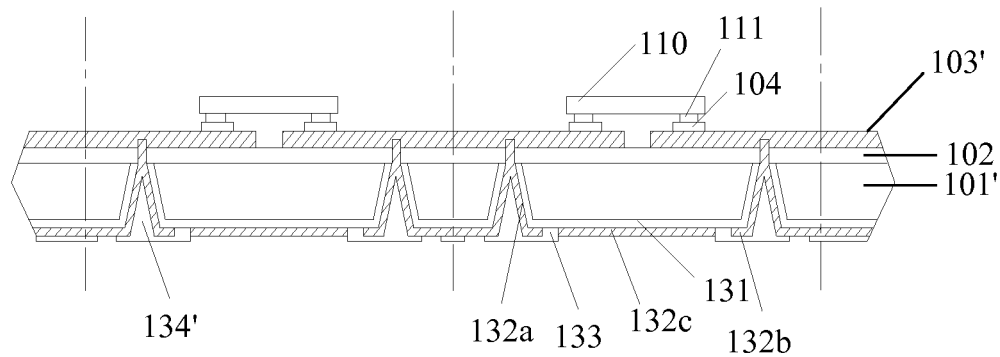

Referring to FIG. 25, the electrodes 111 of the light emitting diode are connected with the bumps 104, the light emitting diode further includes the bare chip 110, and the electrodes 111 of the light emitting diode and the bumps 104 can be connected through a metal bonding process. The metal bonding technique is well known to those skilled in the art, and therefore repeated descriptions thereof will be omitted here.

Thereafter, a cutting process is further performed along the cut channel, and since this process is a conventional process, repeated descriptions thereof will be omitted here.

Based upon the above third embodiment, there is formed a package structure of a light emitting diode according to an embodiment of the invention, with reference to FIG. 25, which includes: a die 101' including a first side and a second side opposite to the first side; a first insulating layer 102 on the first side of the die 101'; at least two wires 103' which are arranged on the first insluting layer 102 and electrically isolated from each other; bumps 104 which are arranged on the wires 103' and adapted to be electrically connected correspondingly with electrodes 111 of a bare chip 110 of the light emitting diode; at least two discrete lead areas on the second side of the die; and leads 132b in the lead areas, electrically isolated from each other and electrically connected correspondingly with the wires 103'.

The leads 132b are electrically connected correspondingly with the wires 103' by Through Silicon Via (TSV).

Also in this embodiment, only one light emitting diode is arranged in each of the dies, but a plurality of light emitting diodes may be packaged over a chip during a practical process. Those skilled in the art can devise a flexible arrangement in view of general knowledge in the art without departing from the scope of the invention. The invention further provides a wafer-level package structure of a light emitting diode in which a light reflecting cup is arranged on the periphery of the light emitting diode for concentrating light beam to enhance brightness.

FIG. 26 to FIG. 30 are schematic structural diagrams of cross sections of a method for manufacturing a wafer-level package structure of a light emitting diode according to a fourth embodiment of the invention.

Figure 26:
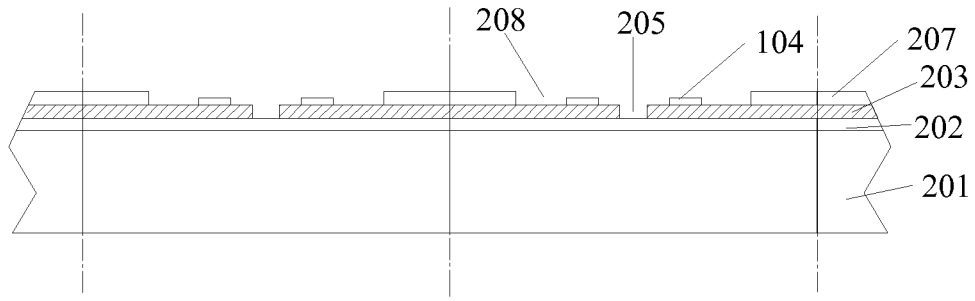
FIG. 26 to FIG. 30 are schematic structural diagrams of cross sections of the method for manufacturing a package of a light emitting diode according to a fourth embodiment of the invention.

Reference is firstly made to FIG. 26, which illustrating a structure including a substrate 201 and a first insulating layer 202, wires 203 and bumps 104 arranged in turn on the substrate 201. Such a structure is formed on the substrate 201 as in the methods according to the foregoing first to third embodiments of the invention, repeated descriptions thereof will be omitted here, and reference can be made to the foregoing FIG. 1 to FIG. 6 and their relevant descriptions.

Referring to FIG. 26 again, an annular second insulating layer 207 is formed on the first insulating layer 202 and the wires 203. The annular second insulating layer 207 surrounds the areas where the two bumps 104 are located, and spaces 208 are arranged between the second insulating layer 207 and the bumps 104. The size of the spaces 208 is dependent upon the actual size of the chip and reserved values of the process.

The second insulating layer 207 may be made of silicon oxide, silicon nitride, silicon oxynitride, etc., and the second insulating layer 207 is adapted to be connected with a subsequent light reflecting cup.

The second insulating layer 207 is in a thickness ranging from 3 μm to 50 μm.

The size of the spaces between the second insulating layer 207 and the bumps is dependent upon the actual size of the chip and reserved values of the process, for example, for accommodation of the light emitting diode, an offset required for installation thereof, a tolerance required for bonding with the light reflecting cup, etc. A distance to the light emitting diode can not be too long, otherwise an excessively long light path might be adverse to light beam concentration.

Figure 27:
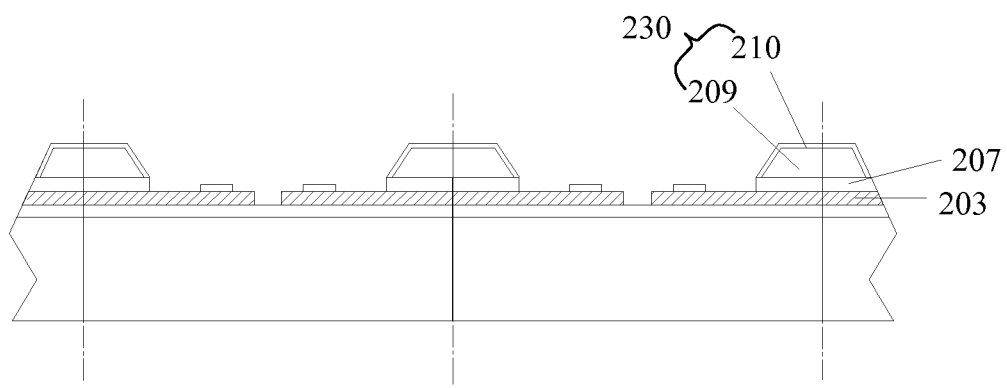

Referring to FIG. 27, there is formed on the second insulating layer 207 the light reflecting cup 230. The space surrounded by the light reflecting cup 230 is shaped in an emanative way in the direction of the light reflecting cup 230 gradually further from the die 201.

The light reflecting cup 230 is formed on the second insulating layer 207 through bonding.

The light reflecting cup 230 and the underlying second insulating layer 207 may be circular or another polygonal annular. The light reflecting cup can be arranged as needed in practice, and the scope of the invention will not be limited.

The light reflecting cup 230 includes a light reflecting wall 209 and a light reflecting layer 210. The light reflecting layer 210 may be made of metal, e.g., aluminum, silver, etc. The light reflecting wall 209 is typically smooth and can offer a light reflecting effect even without any light reflecting layer formed thereon, in which case the light reflecting wall 209 may be made of a material with a low transmissivity, e.g., silicon. However, the light reflecting layer 210 is preferably formed on the light reflecting wall 209 to reduce scattering, and in this case the light reflecting wall 209 may be made of a material for which more options are available, e.g., glass, ceramic, etc.

The light reflecting cup 230 is formed as well known to those skilled in the art, and the light reflecting cup 230 is in a thickness typically ranges from 350 μm to 550 μm.

An angle at which the sides of the light reflecting cup 230 are inclined is associated with a specific application. The angle at which the sides of the light reflecting cup 230 are inclined may be relatively large if light beam concentration is desired, for example, in an application to a flashlight, or may be relatively small if light beam emanation is desired. The angle at which the sides of the light reflecting cup 230 are inclined may typically range from 45 degrees to 55 degrees.

Next, leads are to be formed on the second side of the substrate 201 to be electrically connected with the wires 203. As described above, the leads can be formed on the second side of the substrate 201 in two methods, one of which is to adopt side electrode extracting as illustrated in FIG. 29 to FIG. 32, which constitutes a fifth embodiment of the invention, and the other of which is to adopt Through Silicon Via as illustrated in FIG. 33, which constitutes a sixth embodiment of the invention.

Figure 28:
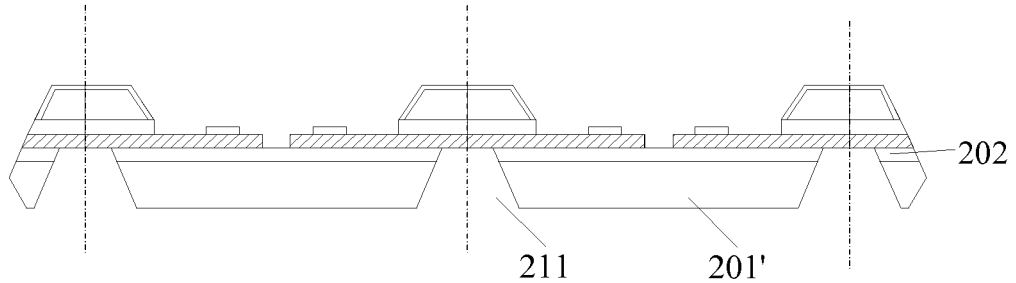

Referring to FIG. 28, firstly the substrate 201 is thinned to form the substrate 201', and then an opening 211 is formed at the location of a cut channel (as illustrated with the dash dotted line). The processes of thinning and of the forming the opening 211 are as described in the foregoing relevant descriptions of FIG. 7 and FIG. 8, and repeated descriptions thereof will be omitted here.

The second side of the die 201 is divided into a heat dissipation area and lead areas.

Figure 29:
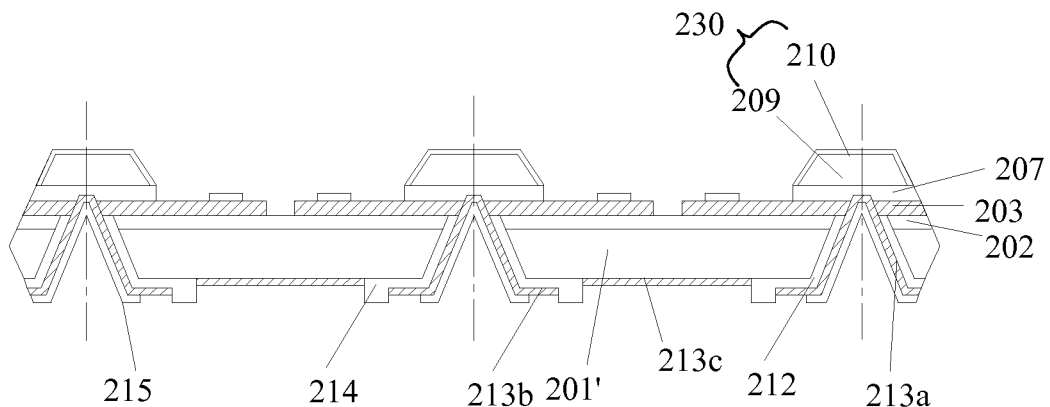

Referring to FIG. 29, a first side insulating layer 212 and side wires 213a are formed on the opening 211, and a second side insulating layer 215 is formed on the side wires 213a; and a heat dissipation layer 213c is formed on the heat dissipation area on the second side of the substrate 201', leads 213b are formed on the lead areas, and an isolation layer 214 is formed between the leads 213b and the heat dissipation layer 213c. The side wires 213a electrically connect the leads 213b and the wires 203 correspondingly.

Reference can be made to the relevant descriptions of FIG. 9 to FIG. 14 regarding a method for manufacturing the above structure, and repeated descriptions thereof will be omitted here.

Figure 30:
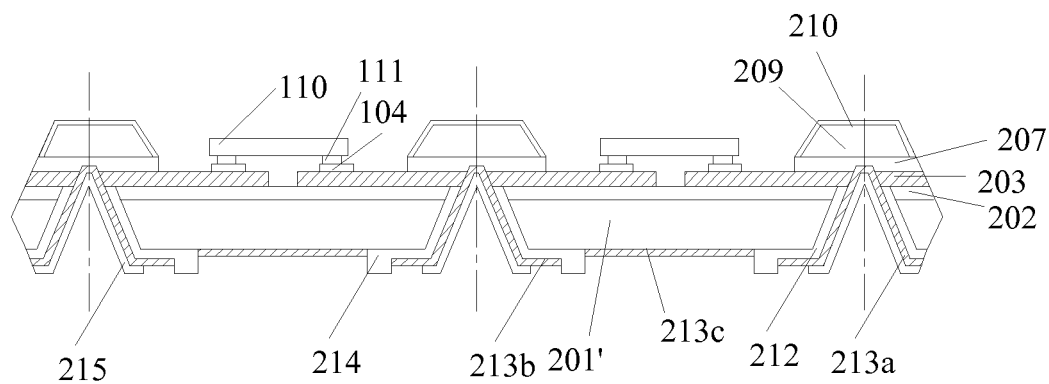

Referring to FIG. 30, the bumps 104 and electrodes 111 of the light emitting diode are connected, the light emitting diode further includes a bare chip 110, and the electrodes 111 of the light emitting diode and the bumps 104 can be connected through a metal bonding process.

Thereafter, a cutting step is performed along the cut channel, and repeated descriptions thereof will be omitted here.

Figure 31:
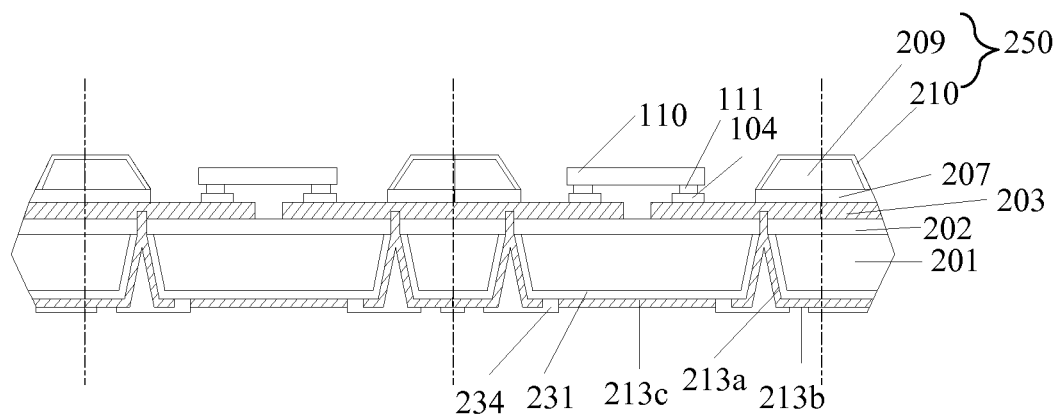
FIG. 31 is a schematic structural diagram of a cross section of the method for manufacturing a package of a light emitting diode according to a fifth embodiment of the invention.

FIG. 31 further presents a wafer-level package structure of a light emitting diode with a light reflecting cup, which is formed by Through Silicon Via and includes: a die 201'; a first insulating layer 202 on the die 201'; wires 203 on the first insulating layer 202 and bumps 204 on the wires 203; an annular second insulating layer 207 on the first insulating layer 202 and the wires 203, which surrounds the areas where the two bumps 204 are located and spaces are arranged between the second insulating layer and the bumps 204; a light reflecting cup 250 on the second insulating layer 207; and leads 213b in two lead areas on the second side of the die, which are electrically connected to the wires 203 through via wires 213a.

There is further formed a heat dissipation area on the second side of the die. A via isolation layer 231 and a heat dissipation layer 232 on the via isolation layer 231 are formed on the heat dissipation area, and an isolation layer 234 is arranged between the heat dissipation layer 232 and the leads 213b.

The bumps 104 are electrically connected with electrodes 111 of the light emitting diode and the light emitting diode further includes a bare chip 110.

Reference can be made to the descriptions of forming the light reflecting cup in FIG. 26 and FIG. 27 and the descriptions of forming the leads by Through Silicon Via in FIG. 18 to FIG. 24 regarding relevant processes of manufacturing the above wafer-level package structure of a light emitting diode with the light reflecting cup 250, and repeated descriptions thereof will be omitted here.

A carrier can also be formed on the first side of the substrate, which is connected with the electrodes of the light emitting diode in the above third to fifth embodiments, and since specific processes of forming the carrier and materials of the carrier are identical to those in the above second embodiment, repeated descriptions thereof will be omitted here. The scope of the invention will not be limited thereto.

A heat dissipation area is formed on the second side of the die in the above first to fifth embodiments, and various layouts of the heat dissipation area and the lead areas are possible. Reference can be made to FIG. 32 to FIG. 37.

Particularly in FIG. 32 to FIG. 37, the pattern 11 represents lead areas, and the pattern 12 represents lead isolation areas between the lead areas and the heat dissipation area 13, and the pattern 14 in FIG. 34 to FIG. 37 represents an isolation area, that is, the second side of the die further includes the isolation area. The heat dissipation area 13 surrounds the isolation area 14, and the isolation area 14 can have an isolation layer formed thereon or the second side of the die can be exposed directly. Preferably, the isolation area 14 have an isolation layer formed thereon and the isolation layer is in the same thickness and of the same material as those of the lead isolation layer.

Figure 32:
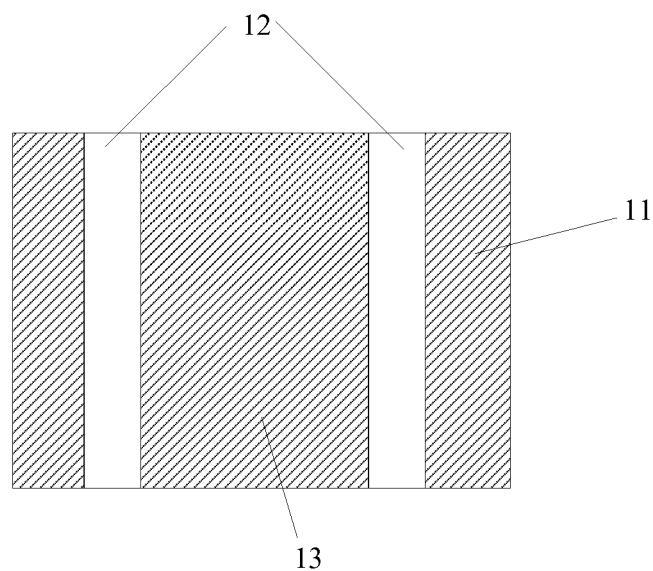
FIG. 32 to FIG. 37 are schematic layout diagrams of a heat dissipation area and lead areas on a second side of a die according to an embodiment of the invention.
Figure 33:
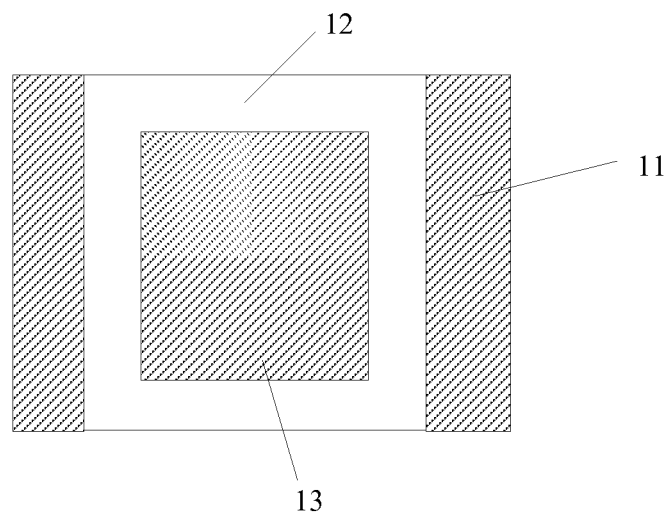
Figure 34:
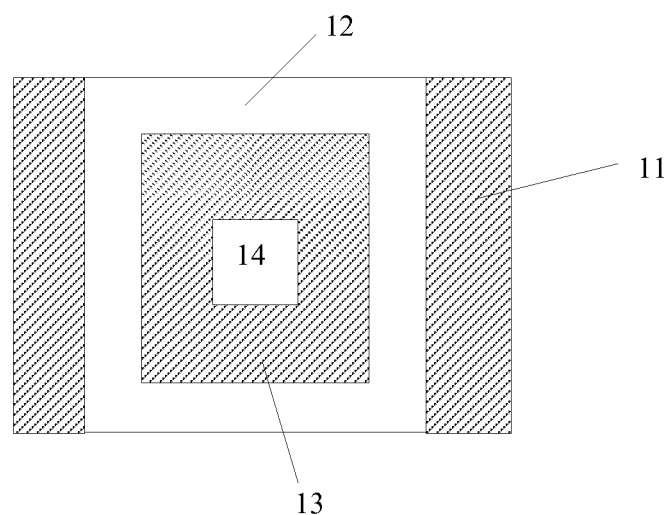
Figure 35:
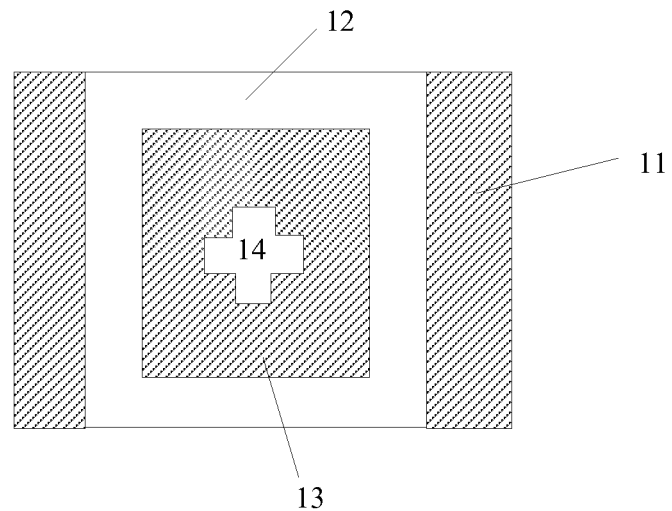
Figure 36:
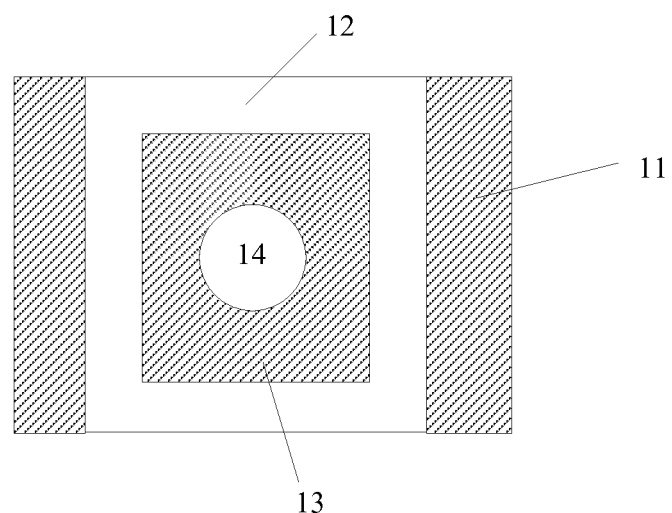

Firstly referring to FIG. 32, the strip-shaped space areas 12 are arranged between the heat dissipation area 13 and the lead areas 11.

Referring to FIG. 33, the space areas 12 are annular and surround the heat dissipation area 13.

Figure 37:
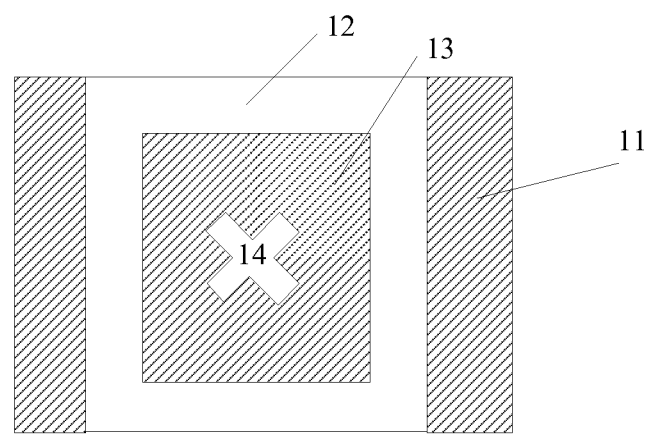

FIG. 34 to FIG. 37 present various shapes of the pattern 14 of the isolation area surrounded by the pattern 13 of the heat dissipation area, respectively a square (FIG. 34), a crisscross "+" (FIG. 35), a circle (FIG. 36) and a fork "x" (FIG. 37).

The layouts of the heat dissipation area in the above embodiments are presented merely for illustration, and other irregular shapes thereof are also possible. They are merely intended to illustrate only a few of various possible layouts of the heat dissipation area, but the scope of the invention will not be limited thereto. Furthermore, a layout of the heat dissipation area can be formed in any of processes in the prior art, which is readily known to those skilled in the art.

However, the layouts in FIG. 34 to FIG. 37 will be preferably adopted among the above layouts of the heat dissipation area and the lead areas, that is, those structures in which the heat dissipation area surrounds the isolation area, so that a force action area can be increased during the bare chip of the light emitting diode is subsequently laminated onto the bumps to increase an endurable pressure, which may facilitate the balance of a support force and hence avoid the substrate from being crushed during lamination, despite reducing area of the heat dissipation area.

Although the invention has been disclosed as above in connection with the preferred embodiments thereof, the scope of the invention will not be limited thereto. Any skilled in the art can make various variations and modifications without departing from the spirit and scope of the invention. Accordingly, the scope of the invention shall be as defined in the appended claims.

What is claimed is:

1. A wafer-level package structure of a light emitting diode, comprising:
    a die comprising a first side and a second side opposite to the first side;
    a first insulating layer on the first side of the die;
    at least two wires which are arranged on the first insulating layer and electrically isolated from each other;
    bumps which are arranged on the at least two wires and adapted to be electrically connected correspondingly with electrodes of a bare chip of the light emitting diode;
    an annular second insulating layer on the at least two wires and the first insulating layer, the annular second insulating layer surrounding an area between the bumps and there being spaces arranged between the annular second insulating layer and the bumps;
    a light reflecting cup on the annular second insulating layer;
    at least two discrete lead areas on the second side of the die; and
    leads in the lead areas, electrically isolated from each other and electrically connected correspondingly with the at least two wires.

2. The wafer-level package structure of a light emitting diode according to claim 1, wherein the annular second insulating layer is made of any one or combination of silicon oxide, silicon nitride, silicon oxynitride, photoresist and epoxy resin.

3. The wafer-level package structure of a light emitting diode according to claim 2, wherein the light reflecting cup comprises a light reflecting wall and a light reflecting layer on the periphery of the light reflecting wall, the light reflecting wall is made of silicon, glass or ceramic, and the light reflecting layer is made of metal.

4. The wafer-level package structure of a light emitting diode according to claim 3, wherein the second side of the die further comprises a heat dissipation area, spaces are arranged between the heat dissipation area and the lead areas, and a heat dissipation layer is formed on the heat dissipation area.

5. The wafer-level package structure of a light emitting diode according to claim 4, wherein a lead isolation layer is formed in areas of the spaces between the heat dissipation area and the lead areas.

6. The wafer-level package structure of a light emitting diode according to claim 5, wherein the leads and the at least two wires are electrically connected correspondingly through side electrode extracting, the side electrode extracting comprises a side opening arranged at a location of a cut channel between adjacent dies, a first side insulating layer, side wires and a second side insulating layer are formed in turn on the side opening, and the leads and the at least two wires are electrically connected correspondingly by the side wires.

7. The wafer-level package structure of a light emitting diode according to claim 6, wherein the first side insulating layer, the second side insulating layer and the lead isolation layer are made of any one or combination of silicon oxide, photoresist and epoxy resin; the first insulating layer is made of any one or combination of silicon oxide, silicon nitride or silicon oxynitride; and the at least two wires, the leads, the side wires and the heat dissipation layer are made of metal.

8. The wafer-level package structure of a light emitting diode according to claim 5, wherein the leads and the at least two wires are electrically connected correspondingly by Through Silicon Via, the Through Silicon Via comprises vias arranged in the die, a first via insulating layer and via wires are formed in turn in the via, and the leads and the at least two wires are electrically connected correspondingly by the via wires.

9. The wafer-level package structure of a light emitting diode according to claim 8, wherein the first via insulating layer and the lead isolation layer are made of any one or combination of silicon oxide, photoresist and epoxy resin; the first insulating layer is made of any one or combination of silicon oxide, silicon nitride or silicon oxynitride; and the at least two wires, the leads, the via wires and the heat dissipation layer are made of metal.

10. The wafer-level package structure of a light emitting diode according to claim 2, wherein the second side of the die further comprises an isolation area which is surrounded by the heat dissipation area, there is formed on the isolation area an isolation layer, and the isolation layer is made of the same material as that of a lead isolation layer.

11. A method for manufacturing the wafer-level package structure of a light emitting diode according to claim 1, comprising:
    providing a substrate, the substrate comprising a first side and a second side
    opposite to the first side and being divided into discrete dies, the second side of the discrete dies
    comprising at least two discrete lead areas;
    forming a first insulating layer on the first side of each of the dies;

forming on the first insulating layer of each of the dies at least two wires electrically isolated from each other and bumps on the at least two wires, the bumps being adapted to electrically connected correspondingly with electrodes of a bare chip of the light emitting diode;

forming on the first insulating layer and the at least two wires an annular second insulating layer, the annular second insulating layer surrounding the area between the bumps and there being spaces arranged between the annular second insulating layer and the bumps;

forming a light reflecting cup on the annular second insulating layer; and forming in lead areas of each of the dies two leads electrically isolated from each other and electrically connected correspondingly with the at least two wires.

12. The method for manufacturing the wafer-level package structure of a light emitting diode according to claim 11, wherein the formation of the light reflecting cup on the annular second insulating layer comprises bonding the light reflecting cup on the annular second insulating layer.

13. The method for manufacturing the wafer-level package structure of a light emitting diode according to claim 12, wherein the second side of the die further comprises a heat dissipation area, spaces are arranged between the heat dissipation area and the lead areas, and the method further comprises forming a heat dissipation layer on the heat dissipation area.

14. The method for manufacturing the wafer-level package structure of a light emitting diode according to claim 13, further comprising forming a lead isolation layer in areas of spaces between the heat dissipation area and the lead areas.

15. The method for manufacturing the wafer-level package structure of a light emitting diode according to claim 14, wherein the leads and the wires are electrically connected correspondingly through side electrode extracting, the side electrode extracting comprises forming a side opening at the location of a cut channel between the adjacent dies, the side opening exposes the wire on the die, a first side insulating layer, side wires and a second side insulating layer are formed in turn on the side opening, and the leads and the wires are electrically connected correspondingly by the side wires.

16. The method for manufacturing the wafer-level package structure of a light emitting diode according to claim 15, wherein the second side insulating layer and the lead isolation layer are made of the same layer of material; and the leads, the side wires and the heat dissipation layer are made of the same layer of material.

17. The method for manufacturing the wafer-level package structure of a light emitting diode according to claim 14, wherein the leads and the wires are electrically connected correspondingly by Through Silicon Via, the Through Silicon Via comprises forming vias in the die, a first via insulating layer and via wires are formed in turn in the via, and the leads and the wires are electrically connected correspondingly by the via wires.

18. The method for manufacturing the wafer-level package structure of a light emitting diode according to claim 17, wherein the leads, the via wires and the heat dissipation layer are made of the same layer of material.

* * * * *